(12) United States Patent
Poock et al.

(10) Patent No.: US 8,660,681 B2
(45) Date of Patent: Feb. 25, 2014

(54) METHOD AND SYSTEM FOR EXCURSION MONITORING IN OPTICAL LITHOGRAPHY PROCESSES IN MICRO DEVICE FABRICATION

(75) Inventors: Andre Poock, Malschwitz (DE); Daniel Zschaebitz, Dresden (DE); Heike Scholtz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 434 days.

(21) Appl. No.: 13/006,522

(22) Filed: Jan. 14, 2011

(65) Prior Publication Data

US 2012/0004758 A1    Jan. 5, 2012

(30) Foreign Application Priority Data

Jun. 30, 2010    (DE) .......................... 10 2010 030 755

(51) Int. Cl.
*G06F 19/00*    (2011.01)
(52) U.S. Cl.
USPC .......................................................... 700/110
(58) Field of Classification Search
USPC .......................................................... 700/287
See application file for complete search history.

(56) References Cited

U.S. PATENT DOCUMENTS

| | | | |
|---|---|---|---|
| 2003/0119216 A1 | 6/2003 | Weed | 438/14 |
| 2004/0233445 A1 | 11/2004 | Littau et al. | 356/401 |
| 2008/0059527 A1* | 3/2008 | Thieme et al. | 707/104.1 |
| 2008/0248412 A1 | 10/2008 | Stuber et al. | 430/30 |
| 2010/0198556 A1* | 8/2010 | Kost | 702/183 |

FOREIGN PATENT DOCUMENTS

DE    199 45 144 A1    4/2001    ............... G03F 1/00

OTHER PUBLICATIONS

Translation of Official Communication from German Patent Office for German Patent Application No. 10 2010 030 755.6 dated Mar. 23, 2011.

* cited by examiner

*Primary Examiner* — Mohammad Ali
*Assistant Examiner* — Ziaul Karim
(74) *Attorney, Agent, or Firm* — Amerson Law Firm, PLLC

(57) ABSTRACT

A process monitoring system may detect out-of-control situations on the basis of a single criterion for a plurality of different lithography processes. To this end, each data set related to a specific type of lithography process may be processed so as to determine relative data, which may be centered around the same mean value for each of the different process types for a standard control situation.

17 Claims, 8 Drawing Sheets

METHOD AND SYSTEM FOR EXCURSION MONITORING IN OPTICAL LITHOGRAPHY PROCESSES IN MICRO DEVICE FABRICATION

BACKGROUND OF THE INVENTION

1. Field of the Invention

The present disclosure generally relates to the field of fabricating semiconductor devices, and, more particularly, to process control and monitoring techniques in lithography processes.

2. Description of the Related Art

Today's global market forces manufacturers of mass products to offer high quality products at a low price. It is thus important to improve yield and process efficiency to minimize production costs. This holds especially true in the field of semiconductor fabrication, since here it is essential to combine cutting edge technology with volume production techniques. It is, therefore, the goal of semiconductor manufacturers to reduce the consumption of raw materials and consumables, while at the same time improve product quality and process tool utilization. For example, in manufacturing modern integrated circuits, several hundred individual processes may be necessary to complete the integrated circuit, wherein failure in a single process step may result in a loss of the complete integrated circuit. This problem is even exacerbated in current developments striving to increase the size of substrates, on which a moderately high number of such integrated circuits are commonly processed, so that failure in a single process step may possibly entail the loss of a large number of products.

Therefore, the various manufacturing stages have to be thoroughly monitored to avoid undue waste of man power, tool operation time and raw materials. Ideally, the effect of each individual process step on each substrate would be detected by measurement and the substrate under consideration would be released for further processing only if the required specifications, which would desirably have well-understood correlations to the final product quality, were met. A corresponding process control, however, is not practical, since measuring the effects of certain processes may require relatively long measurement times, frequently ex situ, or may even necessitate the destruction of the sample. Moreover, immense effort, in terms of time and equipment, would have to be made on the metrology side to provide the required measurement results. Additionally, utilization of the process tool would be minimized since the tool would be released only after the provision of the measurement result and its assessment. Furthermore, many of the complex mutual dependencies of the various processes are typically not known, so that an a priori determination of respective optimum process specifications may be difficult.

The introduction of statistical methods, also referred to statistical process control (SPC), for adjusting process parameters significantly relaxes the above problem and allows a moderate utilization of the process tools, while attaining a relatively high product yield. Statistical process control is based on the monitoring of the process output to thereby identify an out-of-control situation, wherein a causality relationship may be established to an external disturbance. After occurrence of an out-of-control situation, operator interaction is usually required to manipulate a process parameter so as to return to an in-control situation, wherein the causality relationship may be helpful in selecting an appropriate control action. Nevertheless, in total, a large number of dummy substrates or pilot substrates may be necessary to adjust process parameters of respective process tools, wherein tolerable parameter drifts during the process have to be taken into consideration when designing a process sequence, since such parameter drifts may remain undetected over a long time period or may not be efficiently compensated for by SPC techniques.

Recently, a process control strategy has been introduced and is continuously being improved, allowing enhanced efficiency of process control, desirably on a run-to-run basis, while requiring only a moderate amount of a measurement data. In this control strategy, the so-called advanced process control (APC), a model of a process or of a group of interrelated processes, is established and implemented in an appropriately configured process controller. The process controller also receives information including pre-process measurement data and/or post-process measurement data as well as information related, for instance, to the substrate history, such as type of process or processes, the product type, the process tool or process tools in which the products are to be processed or have been processed in previous steps, the process recipe to be used, i.e., a set of required sub-steps for the process or processes under consideration, wherein possibly fixed process parameters and variable process parameters are included, and the like. From this information and the process model, the process controller determines a controller state or process state that describes the effect of the process or processes under consideration on the specific product, thereby permitting the establishment of an appropriate parameter setting of the variable parameters of the specified process recipe to be performed with the substrate under consideration in order to keep the process result close to the preset target.

One important process for the fabrication of microstructure devices such as integrated circuits and the like is the transfer of a required pattern from a template or mask to the actual substrate. That is, the fabrication of microstructures requires tiny regions of precisely controlled size to be formed in a material layer of an appropriate substrate, such as a silicon substrate, a silicon-on-insulator (SOI) substrate or any other suitable carrier material. These tiny regions of precisely controlled size are generated by patterning one or more material layers provided on the substrate by performing lithography, etch, implantation, deposition, oxidation processes and the like, wherein typically, at least in a certain stage of the patterning process, a mask layer is to be formed over the one or more material layers to be treated in order to define these tiny regions. Generally, a mask layer may consist of or may be formed by means of a layer of photoresist that is patterned by a lithography process, which frequently is implemented in the form of an optical or photolithography process. During the photolithography process, the resist may be spin coated onto the substrate surface and is then selectively exposed to ultraviolet radiation through a corresponding lithography mask, such as a reticle, thereby imaging the reticle pattern into the resist layer to form a latent image therein. After developing the photoresist, depending on the type of resist, i.e., positive resist or negative resist, the exposed portions or the non-exposed portions are removed to form the required pattern in the layer of photoresist material. Based on this resist pattern, actual device patterns are then formed by further manufacturing processes, as specified above. The size and shape of the finally obtained features thus strongly depends on the quality of the mask formed on the basis of the resist material and thus makes the lithography process a very important process step in order to precisely define the shape and size of any circuit components, wherein a high degree of precision is also required for appropriately aligning the various mask layers that have to be provided during the entire manufacturing process for completing a complex integrated circuit. That is, typically, a plurality of mask layers or levels are required which are established on the basis of dedicated templates or lithography masks in order to appropriately complete the complex circuit elements, wherein any deviations in size and shape as well as any undue misalignments may generally contribute to significant device variabilities or even total failures upon completing the manufacturing process. For example, a plurality of lithography steps are typically required for providing the various semiconductor-based circuit elements, such as transistors and the like, for instance for forming sophisticated gate electrode structures, implementing appropriate dopant profiles in the semiconductor materials and the like, wherein critical dimensions of 50 nm and even less may have to be realized on the basis of sophisticated lithography processes. In subsequent levels of the semiconductor device, further sophisticated lithography processes may be required, for instance, for defining contact elements for connecting to the semiconductor-based circuit elements, for forming sophisticated metallization systems, which also typically comprise a plurality of stacked metallization layers, and the like.

Since lithography processes are typically extremely cost-intensive process steps due to the complex lithography tools required, great efforts are being made in precisely monitoring and controlling the lithography process module. For example, a typical lithography process may comprise a plurality of pre-exposure processes, such as the deposition of an appropriate resist material, a pre-treatment of the resist material, for instance in the form of heat treatments, and the like. Thereafter, the actual exposure process is performed, wherein, among other things, the amount of energy deposited within the resist material may significantly affect the size of the corresponding resist features after developing the exposed resist material. Furthermore, typically, one or more post-exposure processes in the form of heat treatments and the like may be required in addition to the actual development process. Hence, powerful process control strategies, for example on the basis of APC and SPC, have been implemented by the overall manufacturing process in order to provide superior process quality. That is, the process control and monitoring techniques strive to maintain the process result, i.e., the size and shape of the developed resist features, as closely as possible at a desired target value. Thus, the APC controllers may typically comprise an appropriate model which operates on the basis of a reasonable amount of measurement data that indicates critical dimensions of previously processed substrates, in order to keep the process output at a desired target level that is given by design rules for a specific device layer. To this end, the APC system may provide appropriate parameter values for at least one parameter that may have a significant influence on the final process output. As explained above, the energy or exposure dose used during the exposure process represents a convenient process parameter of the exposure process, which may be appropriately manipulated in order to re-adjust the finally obtained critical dimensions of the resist features. For example, when the measurement data indicate a deviation of the measured resist features from the target value, for instance when the measured resist features are greater compared to the target value, the APC system may determine an appropriate target value for the parameter exposure dose that is to be used in the subsequent exposure process in order to bring back the resulting resist features to the target value, which, in this example, would require an increase of exposure dose. Thus, on the basis of previous measurement data and a predictive model, the APC system may provide re-adjusted exposure dose, which is expected to produce process results closer to the target value.

In complex production facilities for fabricating complex semiconductor devices, typically, a plurality of process tools have to be provided in view of throughput considerations, wherein, to the effect that typically the number of different products is to be processed at the same time within the facility, the different process tools may be used for different processes and products, depending on the overall scheduling regime in the facility. Consequently, a huge amount of measurement data and process parameters may have to be processed by the APC system in order to produce acceptable process results for any product type and any device layer thereof for any combination of process tools used, for instance for performing the lithography process flow. Similarly, in the statistical process control, the tool data and measurement data have to be monitored in order to identify an out-of-control situation. For example, although very efficient APC strategies may be applied, nevertheless out-of-control situations may occur which may remain undetected by the APC system, while nevertheless requiring any corrective activities, since generally a significant shift of the overall process parameters may occur, which may result in a significantly yield loss if the out-of-control situation remains undetected for a pronounced production time. For example, a shift in a metrology tool, which may provide measurement data to the APC system, may cause the APC system to provide re-adjusted exposure dose values to the various lithography tools, which are used for performing the specific exposure process under consideration. In this case, a more or less pronounced deviation in the parameter values for adjusting the parameter exposure dose may be observed, which may, however, be within acceptable ranges, while at the same time the resulting process output may significantly drift away from the target critical dimension of the resist features. In this situation, the APC system may appropriately work, while at the same time the inferior process results may remain non-detected and may enter further subsequent processes, such as etch processes, after which a reworking of the substrates may no longer be possible. To this end, efficient SPC strategies have to be provided which, however, may require the tracking and analyzing, as well as the selection of appropriately set process limits, for a very large number of individual processes, thereby significantly contributing to additional effort and also to a pronounced probability of creating false alarms, which may also reduce overall throughput and thus profitability.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides systems and methods for implementing an efficient process monitoring strategy in which, in particular, out-of-control situations may be detected in a reliable manner, while significantly reducing the number of different valid process ranges in a complex lithography process flow implemented in a manufacturing environment. To this end, process flow related specifics may be appropriately "eliminated" so as to enable establishing a single criterion for monitoring and determining a large number of different types of lithography processes in the manufacturing environment. For this purpose, an efficient "data reduction" may be accomplished on the basis of measurement data and process parameter values relating to at least one process parameter for controlling the lithography process, wherein any process variations may be taken into consideration, while also relative changes in each process flow may be used for an efficient comparison with a preset range of valid process situations. That is, for each type of lithography process, an appropriately weighed value indicating variations or a shift in this specific type of process may be established and these values are assessed with respect to the detection of an out-of-control situation on the basis of process limits commonly defined for any of these different process types. Consequently, out-of-control situations may be efficiently detected on the basis of a single criterion for a large number of different types of lithography processes, thereby significantly enhancing the efficiency of the statistical process control mechanism.

One illustrative method disclosed herein relates to monitoring a lithography process flow in a manufacturing environment. The method comprises receiving a first plurality of parameter values by a monitoring system operatively connected to the manufacturing environment, wherein each of the first plurality of parameter values indicates an exposure state parameter in a first type of lithography process of the process flow when processing a first plurality of substrates. The method further comprises receiving a first plurality of measurement results by the monitoring system, wherein each one of the first plurality of measurement results is associated with a respective one of a first plurality of parameter values. The method additionally comprises comparing in the monitoring system a first global value obtained from each of the first plurality of parameter values and each of the first plurality of measurement results and a variance thereof with a first local value obtained from a subset of the first plurality of parameter values and a subset of the first plurality of measurement results and the variance, wherein the subset of the first plurality of measurement results is associated with the subset of the first plurality of parameter values. Furthermore, the method comprises outputting an out-of-control signal by the monitoring system when a result of the comparison is outside of a predefined valid range.

A further illustrative method disclosed herein relates to monitoring a lithography process flow in a semiconductor manufacturing process sequence. The method comprises performing a plurality of different types of lithography processes by processing a plurality of substrates for each type of lithography process. The method further comprises obtaining parameter values and associated measurement results for each type of the plurality of different types of lithography processes, wherein the parameter values are associated with an exposure parameter and wherein the associated measurement results represent a process output of the plurality of different types of lithography processes. The method additionally comprises determining a weighed ratio for each of the plurality of different types of lithography processes by using the parameter values and the associated measurement results. Additionally, the method comprises comparing each of the weighed ratios with a single predefined valid control range.

One illustrative monitoring system disclosed herein is for determining an out-of-control situation in a lithography process flow during semiconductor production. The system comprises an interface configured to receive process messages from at least one process tool used in the lithography process flow, wherein the process messages comprise parameter values and associated measurement results for each type of a plurality of different types of lithography processes that are performed in the process flow, wherein the parameter values are associated with an exposure parameter and wherein the associated measurement results represent a process output of the plurality of different types of lithography processes. The monitoring system further comprises a monitor unit operatively connected to the interface and configured to extract the parameter values and the associated measurement results from the process messages and to determine a weighed ratio for each of the plurality of different types of lithography processes by using the parameter values and the associated measurement results. The monitor unit is further configured to compare each of the weighed ratios with a single predefined valid control range.

BRIEF DESCRIPTION OF THE DRAWINGS

The disclosure may be understood by reference to the following description taken in conjunction with the accompanying drawings, in which like reference numerals identify like elements, and in which:

FIG. 1c schematically illustrates a plurality of different types of lithography processes that are comprised in the lithography process flow of the environment shown in FIG. 1a;

Figure 1A:
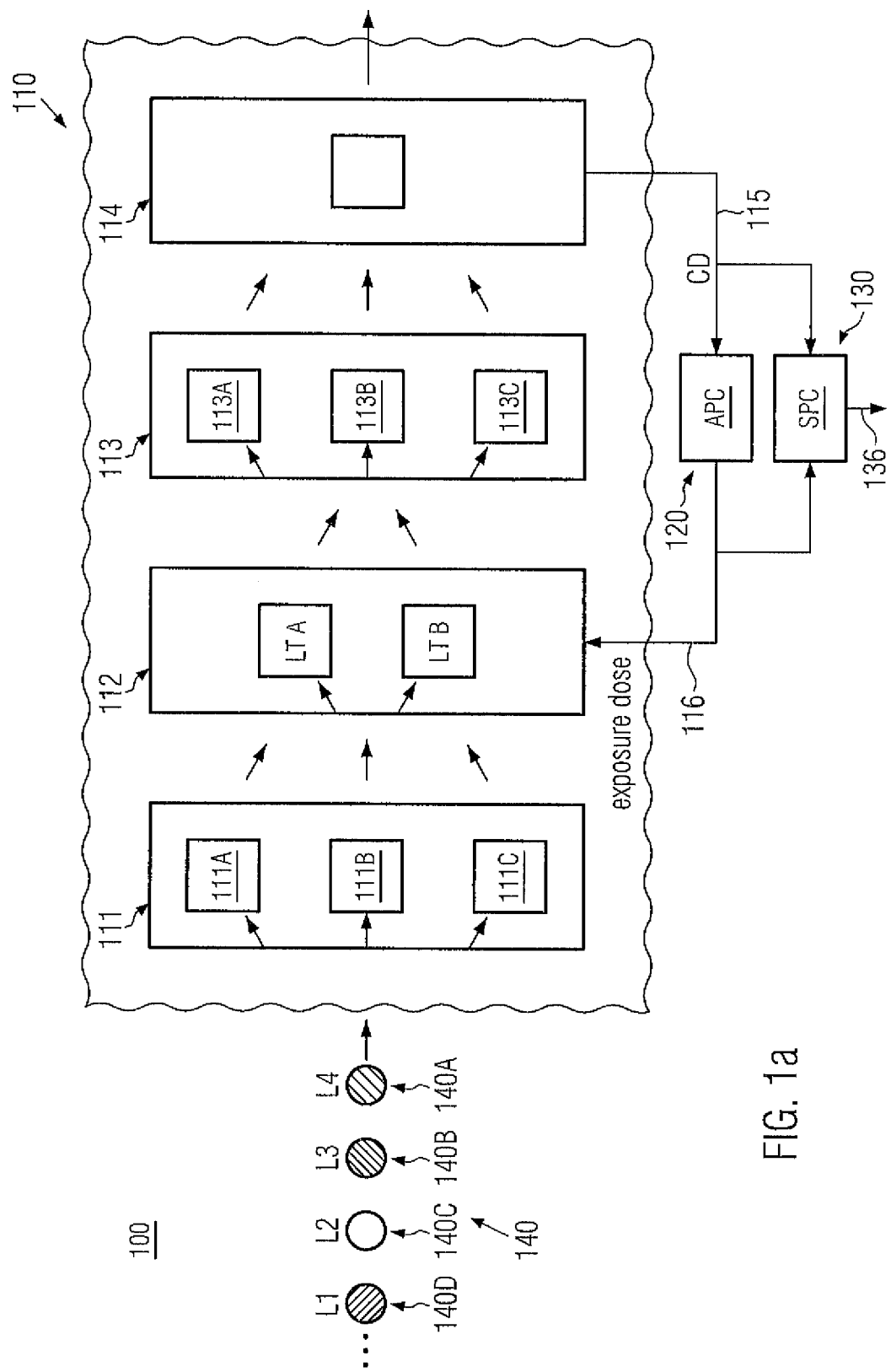
FIG. 1a schematically illustrates a manufacturing environment for forming complex microstructure devices, such as integrated circuits and the like, in which a lithography process flow may be performed on the basis of a plurality of different types of processes, wherein a superior process monitoring system may be implemented, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of monitoring a complex lithography process flow which may comprise a plurality of different types of lithography processes. According to the principles disclosed herein, the process data, i.e., parameter values, measurement results and the like, associated with each type of the different processes may be efficiently evaluated on the basis of appropriate process limits or a valid control range, which may be commonly defined for the plurality of different types of lithography processes. For this purpose, the dependency of the process data on process specific factors, such as the type of lithography tools used, may be eliminated and subsequently the dependency on types of products and the different device levels within different products may be eliminated in order to enable a "global" monitoring of the individual types of lithography processes. Consequently, a single criterion may be used in order to detect any out-of-control situations in any of the many different types of lithography processes, thereby providing superior reliability in detecting any out-of-control situations and also in managing appropriate process limits for appropriately adjusting the parameters for detecting any out-of-control situations. That is, by using a single criterion, such as an appropriately selected upper limit and lower limit of valid process data, any new re-adjustment of the monitoring strategy may be accomplished by re-adjusting the single criterion, rather than having to deal with individual process limits for each type of lithography process.

Generally, the elimination of the various dependencies may be accomplished by selecting appropriate "global" process data for each type of process and selecting an appropriate subset within the global process data, indicated as local process data, in order to generate "relative" process data for each type of different lithography process, which may then be conveniently related, for instance, upon appropriately weighing the relative process data with a single control criterion.

FIG. 1*a* schematically illustrates a manufacturing environment 100, which is to be understood as an appropriate production facility in which a plurality of process tools, metrology tools, including any systems for process control, data exchange resources and the like are implemented in order to produce microstructure devices, or at least to complete any such microstructure devices to a certain state of completeness. For example, the manufacturing environment 100 may represent a production facility for forming sophisticated semiconductor devices, such as micro controllers, ASICS (application specific integrated circuits) and the like. The manufacturing environment 100 may comprise a process module in which a lithography process flow 110 may be performed, wherein it should be understood that, within the process flow 110, any appropriate hardware configuration is available in order to perform the processes as required for transferring a pattern from a lithography mask in to a resist layer, as is also previously described. Thus, within the manufacturing environment 100, a plurality of substrates 140 may be passed through the process flow 110 in order to produce at least resist features of a specific pattern and in compliance with appropriately defined target values on the substrates 140. As previously explained, the substrates 140 typically represent a large number of substrates which may be in very different manufacturing stages and which may represent substrates for forming very different types of products. For convenience, four groups of products, i.e., product groups 140A, 140B, 140C, 140D, are illustrated, while the actual number of substrate groups may be very high. In the example shown, it may be assumed that the substrate groups may represent substrates belonging to the same product type while, however, representing partially different manufacturing stages of the product type under consideration. For example, the substrate group 140D may represent the lithography layer L1 in which appropriate resist features may have to be provided with target values in accordance with the design rules corresponding to the layer L1. Similarly, the substrate group 140C may represent a manufacturing stage in which a lithography process may have to be performed in a further advanced manufacturing stage, i.e., after performing the lithography process for the layer L1 and after forming corresponding circuit components on the basis of the previously provided resist features. Furthermore, the substrate groups 140B, 140A may represent the same manufacturing stage, which may differ from the manufacturing stages of the groups 140D, 140C, wherein, for instance, the fraction of substrates in this manufacturing stage may be higher compared to substrates in the manufacturing stages corresponding to the layers L1, L2, which may, for instance, be caused by any non-predictable delays and the like. It should be appreciated that, typically, a large number of different product types may be present in the manufacturing environment 100, in particular when ASICS are to be formed in the environment 100, since here typically customer specific implementations are to be taken into consideration, thereby requiring corresponding specifically designed lithography masks, appropriately set target values and the like.

The substrates 140 may be entered into the lithography process flow 110 which may be scheduled on the basis of a supervising control system (not shown), as is typically provided in sophisticated semiconductor manufacturing facilities. For example, the process flow 110 may comprise a process module 111 which may represent any pre-exposure processes, such as coating the substrates 140 with a specific type of resist material, which may also be different for different manufacturing stages and/or product types represented by the substrates 140. For example, a plurality of pre-exposure tools 111A, 111B, 111C may be provided within the process module 111. Furthermore, any additional processes, such as pre-bake process tools and the like, may also be provided within the process module 111. Thereafter, a further process module 112 may receive the substrates 140 in order to actually transfer a mask pattern into a resist layer. To this end, sophisticated optical lithography tools are available, wherein, for convenience, a first lithography tool LTA and a second lithography tool LTB are illustrated in the module 112. Furthermore, a post-exposure process module 113 is illustrated so as to comprise a plurality of appropriate process tools 113A, 113B, 113C in which, for instance, post-exposure treatments, such as heat treatments, in combination with the actual development of the exposed resist material, may be performed. Furthermore, the process flow 110 may comprise a process module 114 in which measurement data may be generated in order to monitor the process result within the process flow 110. To this end, any appropriate measurement systems may be used which may provide data indicating, for instance, the critical dimensions of resist features produced by passing the substrates 140 through the process modules 111, 112 and 113. It should be appreciated that, typically, any appropriate number of process tools may be provided for each of the modules 111, 112, 113, 114 in order to comply with the throughput requirements and the number of product types to be processed within the environment 100.

Furthermore, as also previously explained, an advanced process control system 120 may be operatively connected to the process flow 110 in order to reduce process variations and keep process results as closely as possible correlated to the respective target values of the individual lithography processes to be performed in the process flow 110. To this end, the APC system 120 may be appropriately configured in terms of computational resources, data communication resources and the like in order to exchange process messages 115 with the process module 114 and also to exchange process messages 116 with at least the process module 112, i.e., the corresponding lithography tools provided therein, such as the tools LTA, LTB. It should be appreciated that, typically, in complex manufacturing environments, the various process tools or process modules may communicate with each other or with a supervising control system on the basis of standardized process messages, which may have a specific format so as to include therein appropriate data. For example, the process messages 115 may comprise appropriate process data representing the measurement results obtained in the process module 114. For convenience, hereinafter, the corresponding measurement results may also be indicated by reference sign 115. Similarly, the process messages 116 exchanged with at least the process module 112 may comprise appropriate process data which may refer to at least one process parameter for controlling the operation of the process tools in the module 112. For example, an efficient process parameter for controlling the lithography process is the amount of energy deposited in the resist material for a given exposure wavelength, since, in this manner, the finally obtained lateral size of any resist features may be manipulated, as is also discussed above. This parameter may also be referred to as exposure dose and appropriate values may be assigned to the parameter exposure dose in order to appropriately adjust or re-adjust the critical dimensions of any resist features. Also, in this case, any process data contained in the process messages 116 may also be referred to with the same reference sign since, within the present application, any further information contained in the process messages may not be taken into consideration. Consequently, the APC system 120 may receive the measurement results 115 for a specific one of the substrates 140 or a specific group of substrates, such as the groups 140A, 140B, 140C, 140D, which have been processed within the process flow 110 on the basis of a specific type of lithography process, which in turn is associated with a dedicated target value of the corresponding process output. Consequently, the APC system 120 strives to provide the appropriate parameter values for the control parameter, such as the exposure dose, for each individual type of process within the flow 110 in order to obtain the desired process result for each individual process flow.

Moreover, the manufacturing environment 100 may comprise a statistical process control or monitoring system 130 which is operatively connected to the process flow 110 in order to receive the process messages 115, and thus the measurement results contained therein, and also the process messages 116, i.e., the parameter values for the one or more control parameters, such as the exposure dose contained therein. The monitoring system 130 may be configured according to illustrative embodiments disclosed herein in such a manner that a control signal 136 may be established, in which an out-of-control situation of any of the many individual different types of lithography processes within the process flow 110 may be reliably identified on the basis of a single criterion, i.e., a single valid range of process situations defined by, for instance, an upper limit and a lower limit, as will be described later on in more detail. Consequently, by means of the monitoring system 130, any action for re-adjusting the process flow 110 caused by an out-of-control situation may be conveniently initiated on the basis of a simple decision criterion, without requiring the establishment and the management of corresponding valid control ranges for each of the many individual different types of process flows.

Figure 1B:
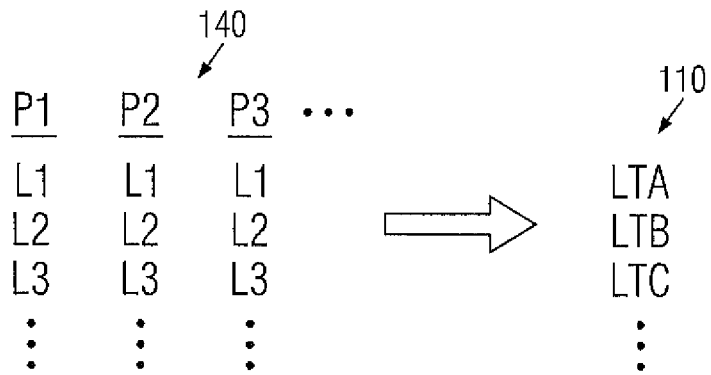
FIG. 1b schematically illustrates a plurality of different products to be processed on the basis of the lithography process flow, according to illustrative embodiments.

FIG. 1b schematically illustrates an overview of the operation of the manufacturing environment shown in FIG. 1a. As illustrated, the plurality of substrates 140 may present different product types P1, P2, P3 . . . , which may be several hundred different product types in sophisticated production facilities for forming application specific ICs. Furthermore, each product type may require a specific number of lithography processes which may be performed on the basis of the lithography process flow 110. It should be appreciated that, if required, different lithography flows may be implemented in the manufacturing environment 100 of FIG. 1*a*, wherein the principles disclosed herein may be efficiently applied to any such additional lithography process flow. Thus, as indicated, each of the products P1, P2, P3 . . . may comprise different lithography layers L1, L2, L3 . . . which may have to be processed in the process flow 110 which is, for convenience, in FIG. 1*b* represented by the plurality of lithography tools LTA, LTB, LTC . . . , wherein, however, it should be appreciated that the further process modules as described above with reference to FIG. 1*a* are also part of the process flow 110. Consequently, based on the complexity of the overall process flow 110, i.e., on the number of lithography tools involved, the number of any pre-exposure and post-exposure tools, and based on the number of different products and complexity thereof, i.e., the number of lithography levels, a significant number of different types of lithography processes may have to be performed within the process flow 110.

Figure 1C:
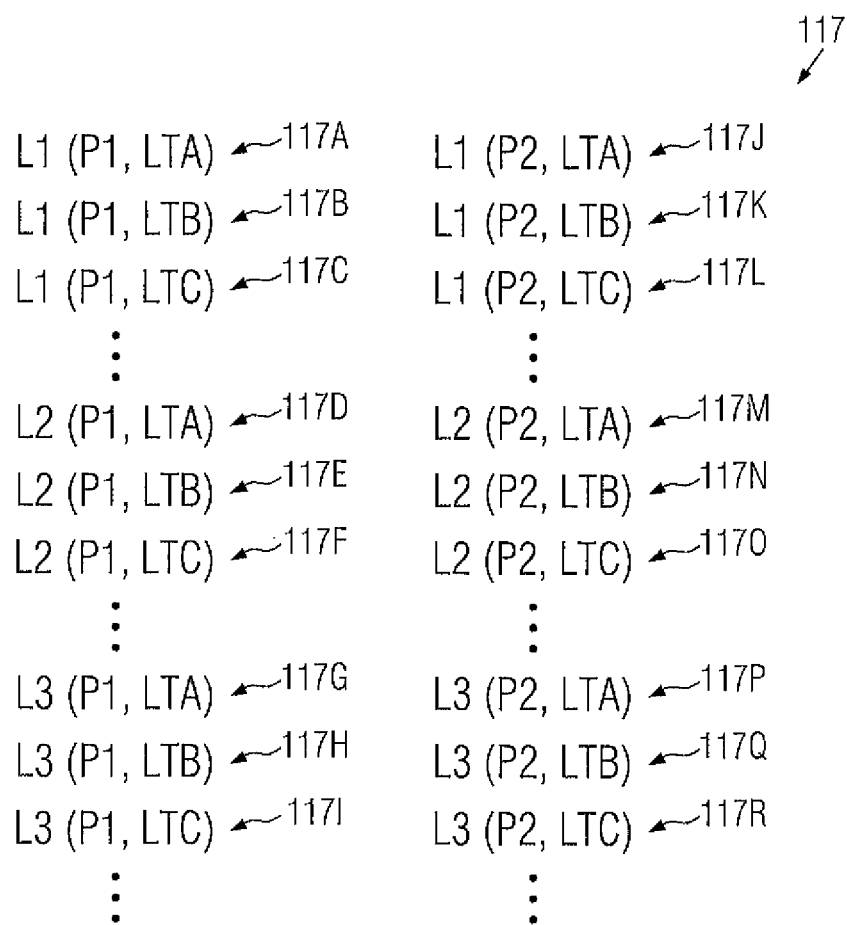

FIG. 1*c* schematically illustrates a listing of different types of process flows 117 to be performed in the context of the lithography process flow 110 of FIG. 1*a*. For example, a first type of lithography process 117A may be represented by a process flow in which the lithography layer L1 of the product P1 may be performed according to a specific process flow path within the process flow 110. For convenience, in FIG. 1*c*, the process flow path may be determined by the lithography tool used, such as the tool LTA. It should be appreciated, however, that if a further "refining" of the different types of lithography processes is desired, further process tools, which may, for instance, provide a different type of resist material, which may perform heat treatments and the like, may also be taken into consideration. In the example shown, the process flow 117A thus differs from a further process flow 117B, in which the same lithography layer L1 of the same product type P1 is processed according to a different process path, for instance by using the lithography tool LTB. Similarly, a process 117C may differ from the processes 117A, 117B by the type of lithography tool used, such as the tool LTC, while the remaining parameters may be the same, such as the type of lithography layer and the type of product. Similarly, lithography processes 117D, 117E, 117F may differ from each other by the type of process tool used and may differ from the processes 117A, 117B, 117C in view of the lithography layer, while these processes may relate to the same product type P1. Similarly, processes 117G-117R may thus represent different types of lithography processes since each of these processes may differ from any other process by at least one of the lithography level, the product type and the lithography tool used.

As previously discussed, it should be appreciated that each of the different lithography processes 117 may thus have its own specifics and consequently a thorough assessment of each of the processes may have to be based on the corresponding process data correlated with the specific process under consideration. It should be appreciated that different processes, which may relate to the same lithography layer of the same product type, for instance the processes 117A, 117B, 117C and the like, may be performed on the basis of the same process target values since, in these processes, the same process result is to be obtained, although different process tools are used. Since the different process tools may have a different behavior, the control of these processes may generally require different manipulated variables, i.e., process parameter values, such as exposure dose values, in order to take into account the different tool behavior in order to obtain the desired output close to the target value.

Figure 1D:
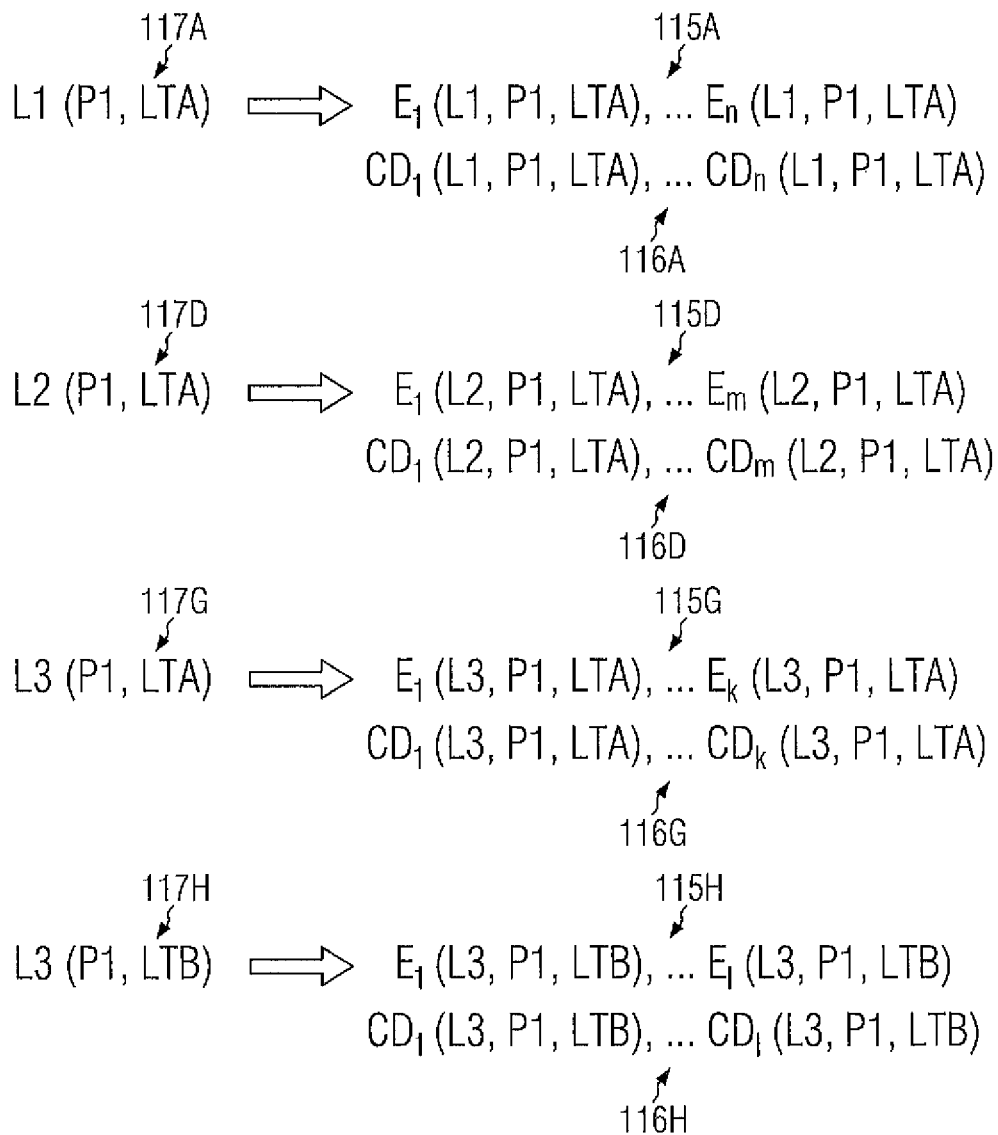
FIG. 1d schematically illustrates a plurality of illustrative steps of processes and corresponding measurement data and parameter values included in appropriate process messages that may be exchanged within the manufacturing environment as shown in FIG. 1a, according to illustrative embodiments.

FIG. 1*d* schematically illustrates some illustrative lithography processes, such as the processes 117A, 117D, 117G and 117H, which may be performed in the process flow 110 of FIG. 1*a*. Consequently, as discussed above, these process flows are correlated with the measurement results 115 and the parameter values 116 (FIG. 1*a*) in such a way that each process has its own set of process data. As shown, the lithography process 117A may be performed on the basis of parameter values 115A, which may represent appropriate dose values for the exposure dose or any other appropriate parameter values in order to control the corresponding lithography tool LTA so as to use the desired exposure dose as predicted by the APC system 120 (FIG. 1*a*). For example, the process type 117A may be performed n times, thereby requiring parameter values $E_1 \ldots E_n$, wherein some of these parameter values may be identical if the APC system does not demand a change in the exposure dose. Moreover, process type 117A may be correlated with measurement results 116A, which may thus be correlated with the corresponding parameter values 115A. For example, measurement results indicating a critical dimension CD may be provided and may thus represent appropriate measurement values, which are used as input parameters for the APC system, as previously discussed. In FIG. 1*d*, the CD measurement results are illustrated as $CD_1 \ldots CD_n$, wherein, however, one of the measurement results may correspond to several parameter values when measurements are not performed for each of the parameter values 115A. Similarly, the process type 117D may be associated with process parameter values 115D and the associated measurement results 116D. Similarly, the process type 117G may be associated with parameter values 115G and measurement results 116G. Finally, the process type 117H may be associated with parameter values 115H and the associated measurement results 116H.

Thus, the illustrative types of lithography processes 117A, 117D, 117G and 117H relate to the same product, wherein the processes 117A, 117D and 117G refer to different lithography layers which are performed by the same lithography tool LTA. On the other hand, the processes 117H relate to the same lithography level as the processes 117G, i.e., these processes are to be performed on the basis of the same target value for any critical dimensions of resist features, wherein, however, these processes are performed by the different process tools LTA and LTB, respectively. It should be appreciated that a corresponding relation between parameter values for the exposure dose 115 and associated measurement results 116 may be established for any of the different types of processes 117 as shown in FIG. 1*c*.

Figure 1E:
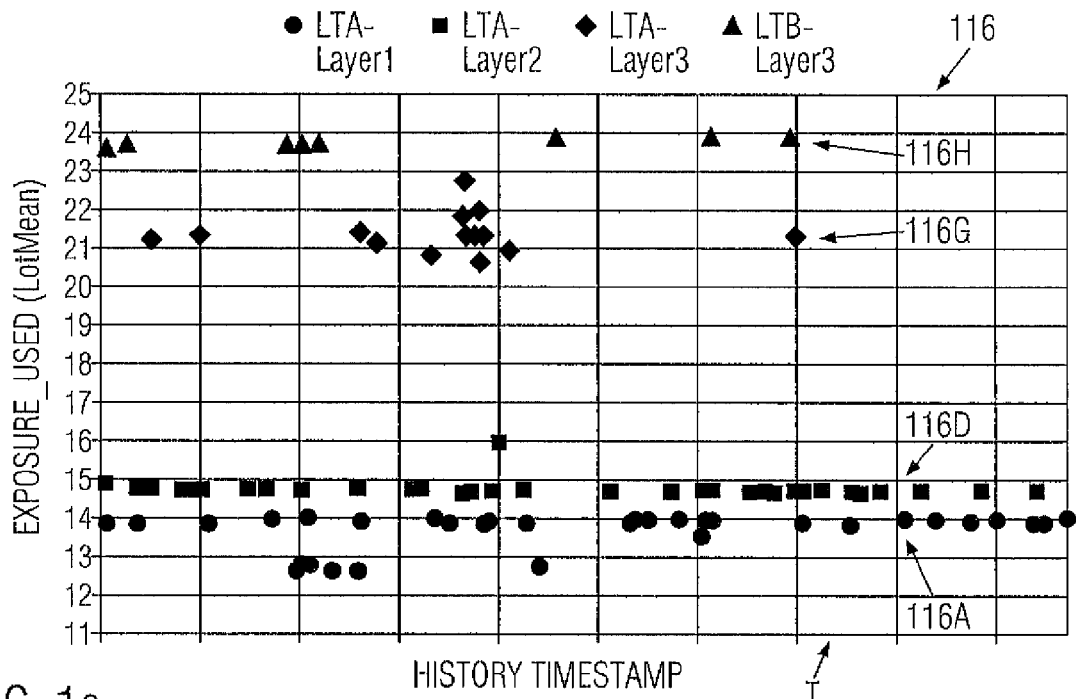
FIG. 1e schematically illustrates a representation of the parameter values for the illustrative different processes of FIG. 1d on the basis of a time stamp associated with the corresponding parameter values, according to illustrative embodiments.

FIG. 1*e* schematically illustrates a graphical representation of the process parameter values 116 as received and processed by the monitoring system 130 (FIG. 1*a*). For convenience, the corresponding parameter value sets 116A, 116D, 116G, 116H for the illustrative types of processes 117A, 117D, 117G and 117H of FIG. 1*d* are illustrated. As illustrated, the process parameter values 116 may be associated with an appropriate time stamp T, which is represented by the horizontal axis of FIG. 1*e*. That is, each data item of each of the process parameter values 116 has assigned thereto a corresponding time stamp T which enables a precise correlation between the lithography processes 117, the measurement results 115 and parameter values 116, as is previously discussed with reference to FIGS. 1*a*-1*d*. The vertical axis in FIG. 1*e* represents a process parameter, such as the exposure dose, in arbitrary units in order to indicate the exposure dose. Thus, for example, as shown for the parameter value set 116A, in some processes, a deviation of approximately ten percent may be observed, which means that the APC system may have requested a reduced exposure dose due to any deviations in the measurement results associated with any previous processes of the same type. Moreover, the process data 116D indicate that a more or less stable processing has been obtained for the corresponding lithography layer with a deviation of approximately ten percent. Furthermore, the process data sets 116H, 116G refer to the same type of product and lithography layer, however, the processes have been performed on different lithography tools, as previously explained. Thus, although the lithography tools may be very similar in configuration and the same target values have been used, significantly different exposure dose values have been used in order to obtain the desired process result. It should be appreciated that corresponding differences between the process data sets 116H and 116G may be caused by additional differences, for instance when different post-exposure and/or pre-exposure process tools may be used in combination with different lithography tools.

Figure 1F:
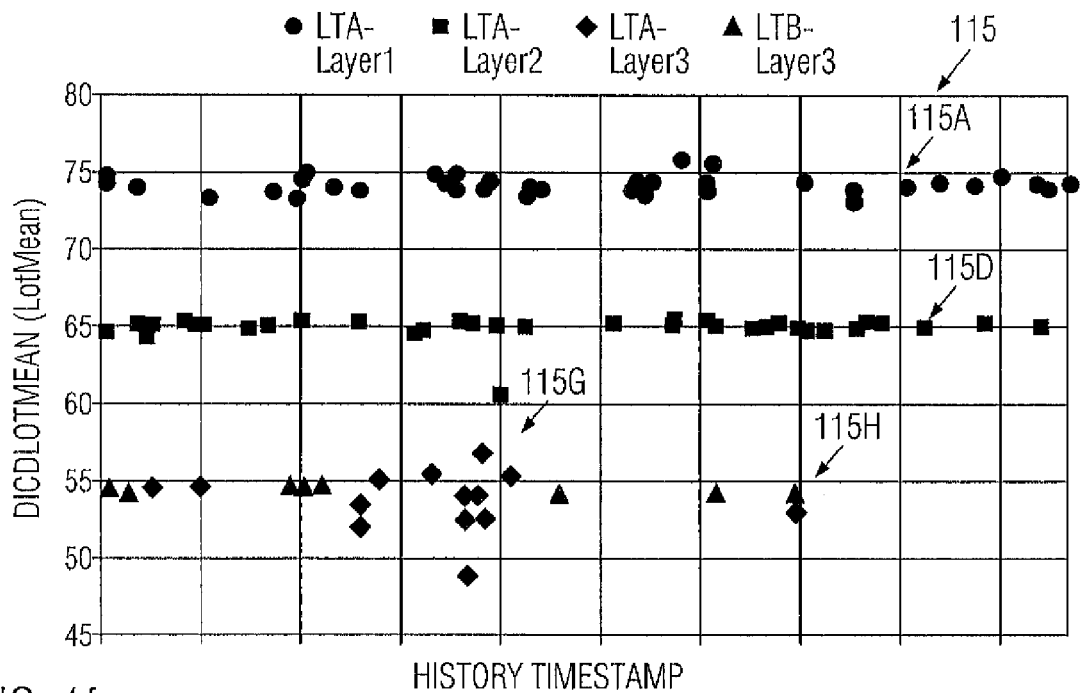
FIG. 1f schematically illustrates measurement results associated with the illustrated process flows, according to illustrative embodiments.

FIG. 1f schematically illustrates the process parameter values 115 for the above-identified illustrative types of process flow. Also in this case, the horizontal axis may represent the time stamp for each data item, while the vertical axis may represent any appropriate measurement result, such as a critical dimension of a resist feature and the like. As shown, the measurement results 115G, 115H, which refer to the same product and the same lithography layer, may generally be centered around the same target value, wherein the degree of variance may depend on process specific characteristics, such as the type of lithography tool used. Similarly, the measurement results 115A and 115D may be centered around the corresponding target values for the specific lithography layer under consideration.

It should generally be appreciated that the various items of the process data 115, 116 may represent averaged values, which may be obtained on the basis of a specific group or lot of substrates, wherein the number of members per group or lot may vary and may even be one single substrate per group or lot. It should also be appreciated that corresponding exposure dose values and measurement data may be obtained from specific positions within a substrate and the corresponding values may also represent averaged values with respect to specific substrate positions.

As shown in FIGS. 1e and 1f, the process data 116 may depend on each individual characteristic of the corresponding process type, while the measurement results 115 are tool independent groups of measurement data.

Figure 1G:
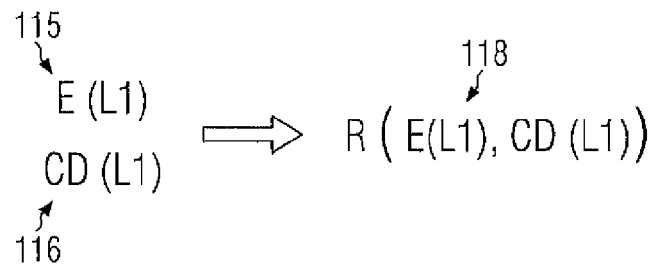
FIG. 1g schematically illustrates a "data reduction" strategy for providing process data that substantially do not depend on specific lithography tools or other process tools, according to illustrative embodiments.

FIG. 1g schematically illustrates the strategy implemented in the monitoring system 130 (FIG. 1a) in order to reduce or eliminate the dependency on process tool specific characteristics in the process data 115, 116. As illustrated, the data 115, 116 may be appropriately combined into reduced process data 118, which, for instance, in some illustrative embodiments, may be accomplished by determining appropriate ratio, wherein each ratio may depend on an individual set of process parameter values and an associated set of measurement results. For example, each process parameter value may be set into proportion to the associated measurement result, for instance by simply dividing the corresponding measurement result by the associated parameter value. It should be appreciated, however, that any other strategy may be applied, for instance by adding an offset to one or both of the process data sets 115, 116 and determining any type of ratio on the basis of the newly obtained process data. Similarly, each process data 115, 116 may be individually scaled in an appropriate manner prior to obtaining a corresponding ratio.

Figure 1H:
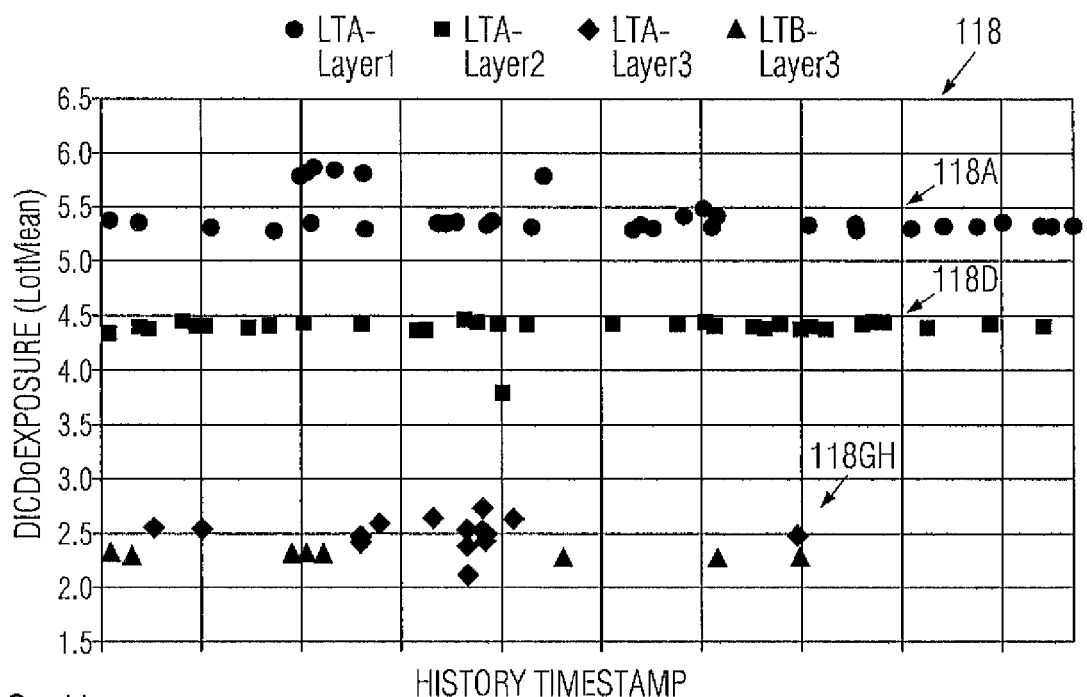
FIG. 1h schematically illustrates corresponding reduced process data obtained on the basis of the strategy as shown in FIG. 1g.

FIG. 1h schematically illustrates the reduced process data 118 for the above-identified illustrative types of processes when processed within the monitoring system 130 of FIG. 1a. As illustrated, a first set of reduced process data 118A may be obtained, which may now reflect the measurement results and also the corresponding process parameter values used. Similarly, the process data set 118D illustrates the resulting values which, however, may significantly differ from the values of the set 118A. Furthermore, the reduced data set 118GH may represent the corresponding data based on the measurement results and process parameter values used for the same lithography layer but for different lithography tools. Generally, also the values are centered around any mean value, which is also significantly different from the corresponding mean values for the data sets 118A, 118D. Thus, the reduced data 118 may represent process data which may form layer specific groups, i.e., specific groups for the different types of products and the different manufacturing stages while, however, different lithography tools used for the same lithography layer may be considered on the basis of the same reduced data set, such as the data set 118GH. It should be appreciated that if different lithography tools are used for the layers represented by the data sets 118A, 118D, these data sets could also be evaluated on the basis of a corresponding mean value. Thus, the various data sets 118A, 118D and 118GH may be analyzed in view of identifying any out-of-control situations, wherein, however, each of these data sets may still require individually determined process limits.

Figure 1I:
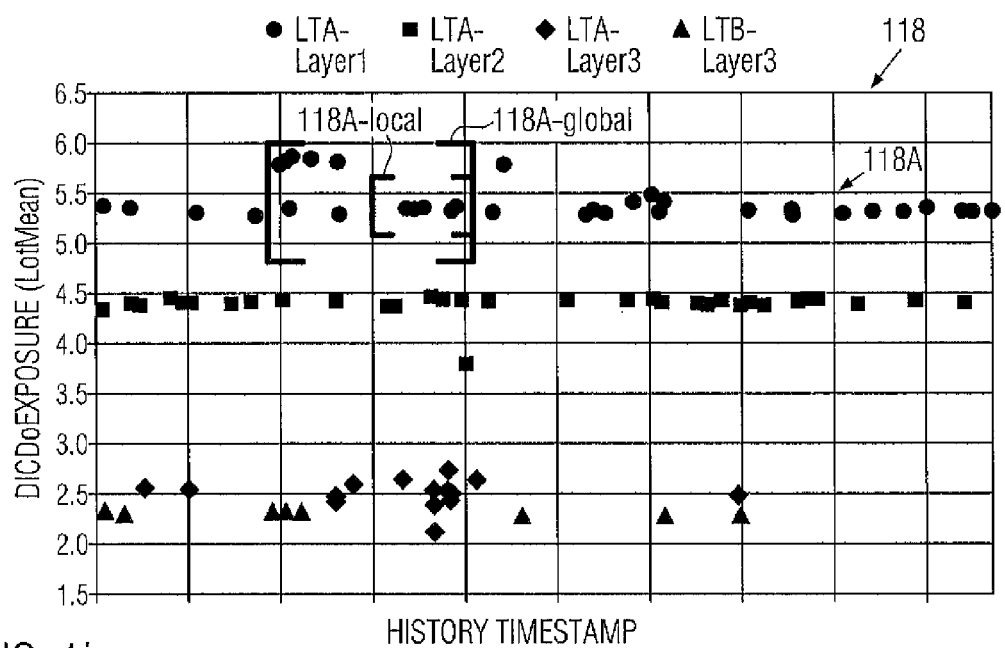
FIG. 1i schematically illustrates the reduced process data and a strategy for further reducing the data on the basis of "global" process data and "local" process data for each device layer, according to illustrative embodiments.

FIG. 1i schematically illustrates a data manipulation strategy implemented in the monitoring system 130 of FIG. 1a in order to further reduce the data so as to enable an assessment with respect to out-of-control situations on the basis of a single criterion used for any of the different process types. As illustrated, the reduced process data 118 may represent appropriate monitor data sets for each of the individual lithography layers and product types. According to the principles disclosed herein, for each of the different data sets, as is illustratively discussed with reference to the data set 118A, a procedure may be applied in which the statistically relevant information may be preserved, while at the same time a quantitative measure may be obtained for each data set that may be compared with a quantitative measure of the different data set, thereby avoiding the introduction of individual process limits for each of the data sets. For example, the data set 118A may be grouped into a plurality of data items, which may represent a sequence of subsequent processes and which may provide a statistically solid basis for determining a meaningful variance, for instance in the form of a standard deviation. A corresponding plurality of data items may also be referred to as global data items or values, as indicated in FIG. 1i with the reference sign 118A-global. For example, the data items 118A-global may thus be appropriately represented by a mean value and a standard deviation. It should be appreciated that the size of the interval 118A-global may be selected in accordance with process requirements. For example, in some illustrative embodiments, 8-15 data items may be included, for instance 10 data items. Furthermore, with the interval 118A-global, a subset of data items may be determined, for instance the most recent data items corresponding to the time stamp T, wherein a corresponding subset may also be referred to as local data items, as indicated by 118A-local. The subset 118A-local may be selected such that a sufficient sensitivity to relatively "fast" changes may exist compared to the global mean value. For this purpose, one or more data items, however significantly less compared to the global data items, may be selected. For example, 1-5 data items may be selected when a plurality of global data items 118A-global is selected in the above-specified manner. Thus, the most recent "development" within the interval 118A-global may be represented by a mean value of the interval 118A-local, wherein the degree of variance may be estimated on the basis of the standard deviation of the global data items 118A-global. Consequently, by "moving" the intervals 118A-global including the local data items 118A-local along the time scale, reduced data values may be obtained for the data set 118. Similar data reduction procedures may be applied to the data sets of any of the different process types, as for instance shown for the exemplary data sets 118D and 118GH of FIG. 1h.

Figure 1J:
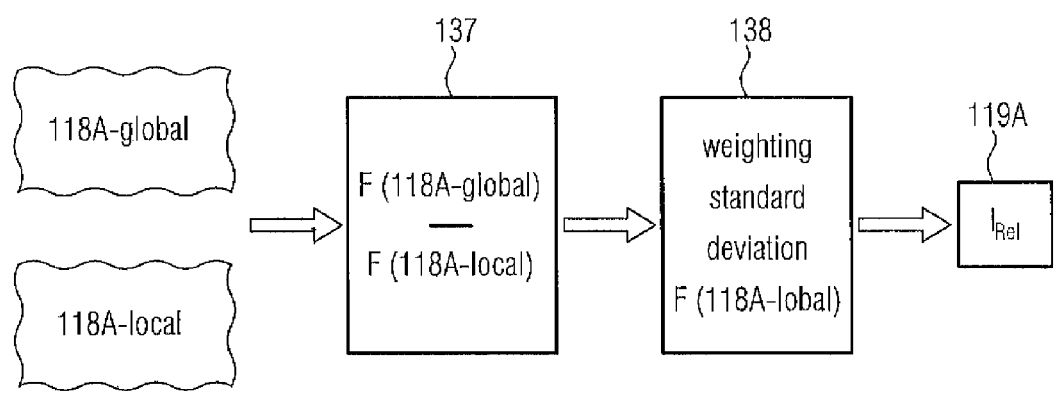
FIG. 1j schematically illustrates a strategy for obtaining relative process data on the basis of the data reduction strategy as shown in FIG. 1i, according to illustrative embodiments.

FIG. 1j schematically illustrates a mechanism implemented in the monitoring system 130 of FIG. 1a in order to further process the data obtained on the basis of the global interval 118A-global and the local interval 118A-local. As illustrated, the corresponding data, such as mean values and the like, may be manipulated in order to obtain a relative value, which may have a similar magnitude for any of the different process types, as long as significant excursions are not involved. For example, in one illustrative embodiment, a comparison 137 may be performed with a function of any value representing the interval 118A-global, such as a mean value, and a function of the value representing the local interval 118A-local, such as the mean value thereof. For example, a comparison 137 may be applied by determining a difference of the mean values of these intervals. In a further illustrative embodiment, the result of the comparison 137, such as the difference of mean values, may be appropriately weighed 138 by a statistically relevant number, which may indicate the variance of the process parameter values 115 and/or the measurement results 116, which may be implicitly present in the corresponding process data 115, 116 and thus also in the reduced process data 118 (FIG. 1g). For example, in some illustrative embodiments, the standard deviation may be determined for the data items in the global interval 118A-global (FIG. 1i) and may be used for weighing the result of the comparison 137. For example, the corresponding standard deviation may be multiplied by an appropriate factor in order to adjust the sensitivity with respect to the variance of the basic process data 115, 116. Consequently, by appropriately weighing the result of the comparison 137, appropriate relative data may be obtained, as indicated by 119A for the reduced data set 118A (FIG. 1i). Similarly, corresponding relative data may be obtained for any type of processes, wherein the relative data may be assessed on the basis of a single criterion, i.e., on the basis of an upper limit and a lower limit, which may thus apply commonly for any of the different process types. For example, the relative data 119A may be calculated on the basis of the following formula:

$$I_{rel}(119a) = (1/(3 \times STD)) \times (MEAN_{118a\text{-}local} - MEAN_{118a\text{-}global}) \quad (1)$$

wherein $MEAN_{118a\text{-}global}$ represents the mean value of the data items in interval 118a-global, $MEAN_{118a\text{-}local}$ the mean value of the data items in interval 118a-local and STD is the standard deviation obtained from the data items in the interval 118a-global.

Corresponding relative values 119B, 119GH (FIG. 1k) for the layers 1, 2 and 3 may thus be established for any of the reduced data sets 118, wherein the relative values may have very similar values centered around 0, thereby enabling an efficient assessment with respect to any out-of-control situations on the basis of common upper and lower limits for the values 119.

Figure 1K:
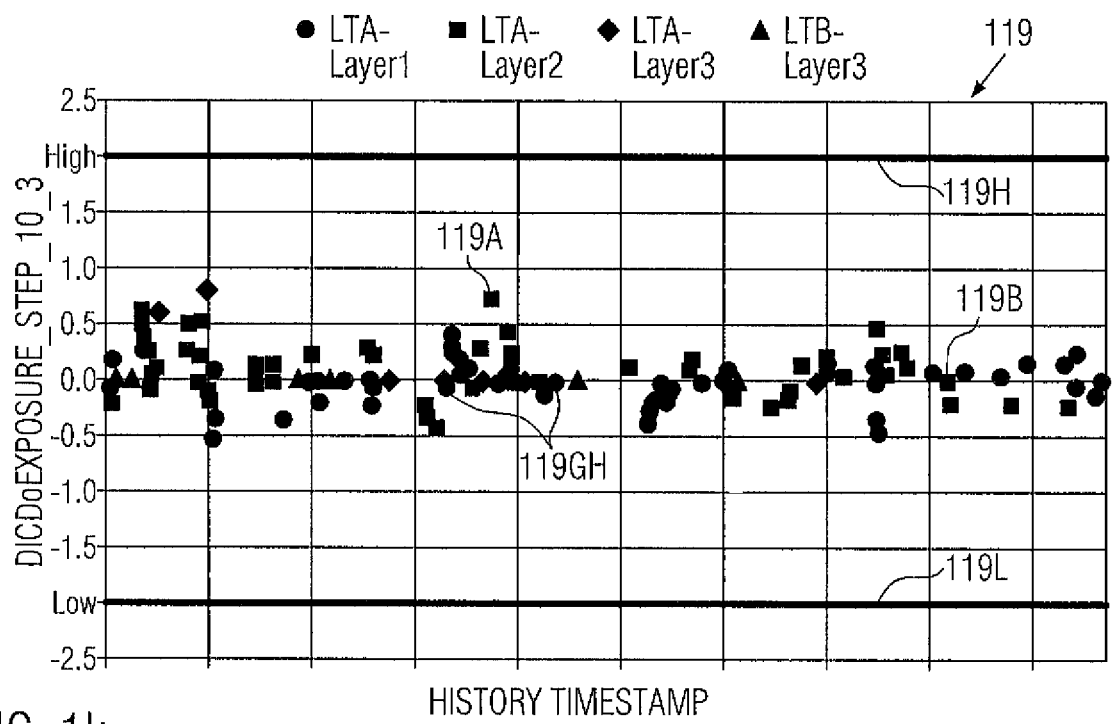
FIG. 1*k* schematically illustrates process data obtained on the basis of the different types of processes using appropriate reduction strategies and a single criterion for defining process limits, according to illustrative embodiments.

FIG. 1k schematically illustrates the relative values 119 obtained on the basis of the techniques described above for the illustrative reduced data sets 118A, 118B and 118GH (FIG. 1i). As illustrated, the corresponding relative values 119A, 119B and 119GH may be centered around 0, wherein each of the corresponding data items thus comprises the statistical information, for instance the variance of the respective type of processes, which is basically contained in the basic process data 115, 116 (FIG. 1c). Furthermore, as indicated, an upper limit 119H and a lower limit 119L are defined so as to define a valid control range, which in the example shown may range from −2 to 2. It should be appreciated, however, that other values may be selected which may be accomplished by analyzing appropriate historical process data for which any out-of-control situations are known.

In some illustrative embodiments, the sensitivity of the data reduction mechanism described above may be reduced for cases in which generally a certain type of process may run at very low standard deviation since, in this case, even more differences between the mean values in equation 1 may result in a pronounced deviation of the corresponding relative value 119. In order to restrict the sensitivity in these cases so as to obtain meaningful relative values, in some illustrative embodiments, a minimum weighing factor may be introduced which may be used when the weighing factor obtained on the basis of the standard deviation is less than the minimum predefined weighing factor. For example, a minimum weighing factor or "standard deviation" may be selected to several percent of the mean value of the global interval, such as the interval 118A-global shown in FIG. 1i. In this case, equation 1 can be modified to:

$$I_{rel}(119) = [1/(MAX(STD_{min}, 3STD)] \times (MEAN_{118\text{-}local} - MEAN_{118\text{-}global}) \quad (2),$$

wherein $STD_{min}$ is the predefined minimum weighing factor. For example $STD_{min}$ may be selected to $0.02 \times MEAN_{118\text{-}global}$.

It should be appreciated, however, that the corresponding "damping" of the sensitivity for low variance data sets may be established in any other appropriate manner on the basis of the above-described strategy.

Figure 1L:
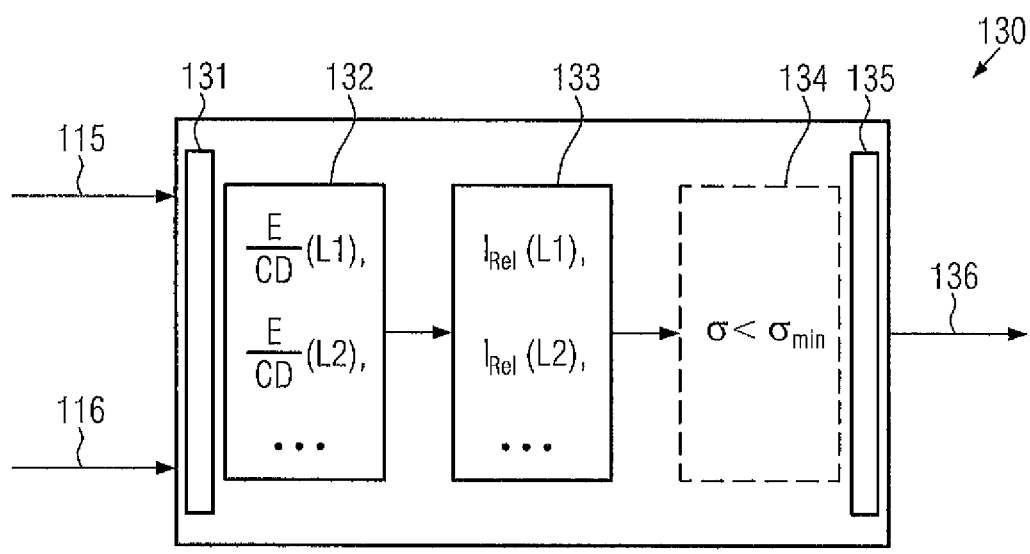
FIG. 1*l* schematically illustrates a more detailed view of the SPC system as shown in FIG. 1*a*, including various system modules for obtaining appropriate relative process data and an appropriate single criterion for defining a valid control range, according to illustrative embodiments.

FIG. 1l schematically illustrates the monitoring system 130 according to illustrative embodiments in which at least some of the above-identified process strategies are implemented. The monitoring system 130 may comprise a first interface 131, which may be appropriately configured so as to receive the process messages 115, 116, which may be provided by a supervising control system (not shown), by the APC system 120 (FIG. 1a) or directly by corresponding process tools and the like. For example, the interface 131 may be configured to communicate with the manufacturing environment on the basis of standard protocols, as are typically used for tool communication in complex semiconductor facilities. The monitoring system 130 may further comprise a first module 132 connected to the interface 131 and configured to appropriately extract the process parameter values and measurement results from the process messages 115, 116 and to manipulate corresponding data for the further processing, as is also discussed above. For example, the module 132 may generate appropriate reduced data, such as the process data 118 as previously explained with reference to FIG. 1h. The system 130 may further comprise a process module 133 configured to generate further reduced process data, such as the relative data 119 (FIG. 1k), which may be accomplished on the basis of the above-described process strategies. Additionally, in some illustrative embodiments, the system 130 may comprise a module 134 for comparing the variance or standard deviation with a predefined minimum weighing factor, as discussed above, wherein, when the variance of the reduced process data is less than the predefined minimum variance, the minimum variance may be used for determining the relative data for the corresponding type of process. Furthermore, the system 130 may comprise a further module 135 that is configured to provide the output signal 136, which may also contain any indication of an out-of-control situation when the relative data of one or more of the different types of processes are outside of a valid control range, as defined by the preset upper and lower limit, such a the limits 119L, 119H as shown in FIG. 1k.

Generally, the system 130 may be implemented on the basis of appropriately designed hardware, such as appropriately configured interfaces in combination with computer devices and the like, in which the above-described methods may be implemented in software or, at least partially, in hardware. To this end, a plurality of hardware components are available, which may be appropriately combined so as to obtain the above-described process monitor.

Figure 1M:
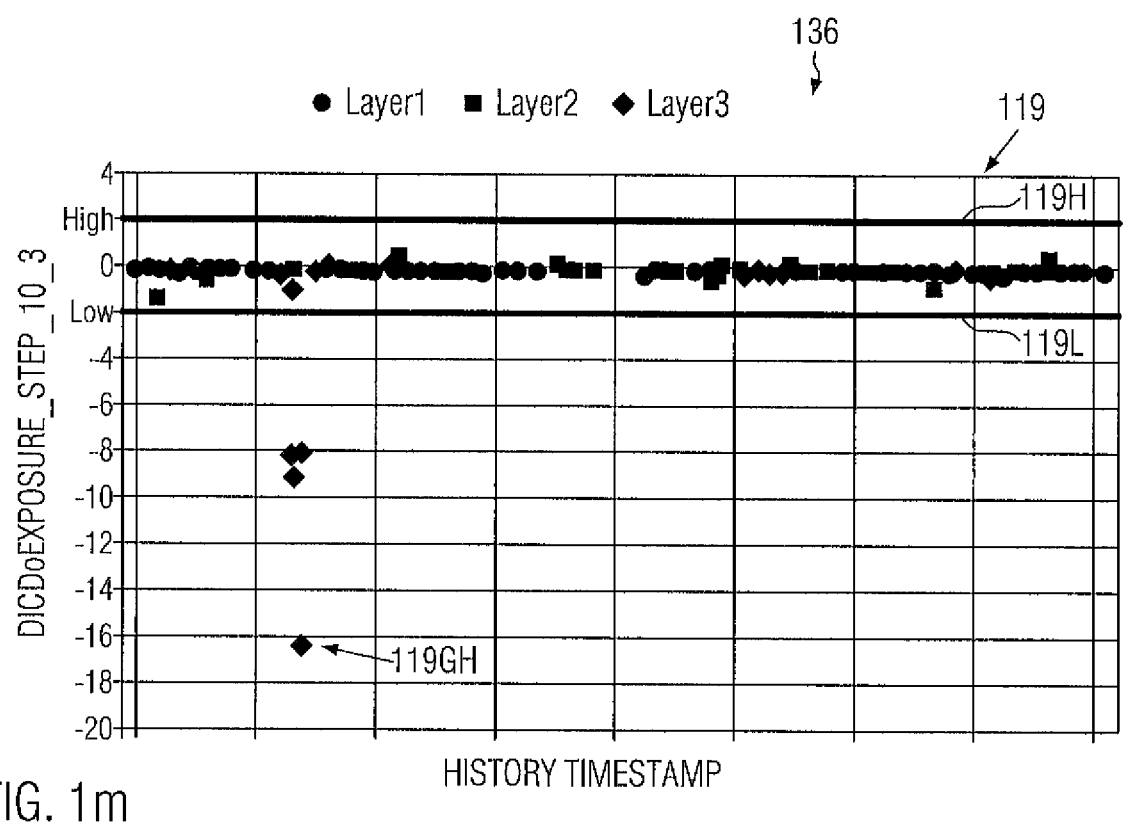
FIG. 1*m* schematically illustrates output data or an output signal of the system as shown in FIG. 1*l*, thereby also indicating an out-of-control situation, according to still other illustrative embodiments.

FIG. 1m schematically illustrates an example of the output signal 136, which may also indicate an excursion or an out-of-control situation. For example, the relative data 119GH may be well outside of the valid range 119H, 119L for a plurality of processes. The basic process data, i.e., the parameter values 115 and the associated measurement results 116 for these processes, did not reflect any pronounced deviation and thus the APC control system 120 (FIG. 1a) performed within a well-defined control regime. Upon operator interaction triggered by the signal 136, it has been recognized, however, that the measurement data were based on wrong measurements obtained from the metrology module 114 (FIG. 1a), wherein the APC system provided re-adjusted process parameter values to the corresponding lithography tools in order to maintain the process result as closely as possible at the target value, wherein actually a significant deviation had occurred.

Consequently, the corresponding out-of-control situation may be reliably detected on the basis of the above-described process strategy while using a single criterion for evaluating the validity of a plurality of different process types.

As a result, the present disclosure provides systems and methods in which out-of-control situations may be detected on the basis of a single criterion for a plurality of different lithography process types, which may be accomplished by efficiently eliminating the dependency on tool and product specific characteristics.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of monitoring a lithography process flow in a manufacturing environment, the method comprising:
   receiving a first plurality of parameter values by a monitoring system operatively connected to said manufacturing environment, each of said first plurality of parameter values indicating an exposure state parameter in a first type of lithography process of said process flow when processing a first plurality of substrates;
   receiving a first plurality of measurement results by said monitoring system, each one of said first plurality of measurement results being associated with a respective one of said first plurality of parameter values;
   comparing, by said monitoring system, a first global value obtained from each of said first plurality of parameter values and each of said first plurality of measurement results and a variance thereof with a first local value obtained from a subset of said first plurality of parameter values and a subset of said first plurality of measurement results and said variance, said subset of said first plurality of measurement results being associated with said subset of said first plurality of parameter values; and
   outputting an out-of-control signal by said monitoring system when a result of said comparison is outside of a predefined valid range.

2. The method of claim 1, wherein said first global and local values are determined on the basis of a ratio of each of said first plurality of parameter values and an associated one of said first plurality of measurement results.

3. The method of claim 2, wherein said first global and local values are determined by using mean values of said ratios.

4. The method of claim 2, wherein said variance is determined by using a standard deviation of said ratios.

5. The method of claim 4, wherein said variance is determined by weighing said ratios with a value that is proportional to said standard deviation.

6. The method of claim 4, further comprising selecting a predefined minimum variance when said standard deviation is less than said predefined minimum variance.

7. The method of claim 1, wherein each of said first plurality of parameter values has associated therewith a time stamp and wherein said subset of said first plurality of parameter values represents the most recent parameter values according to said time stamps.

8. The method of claim 1, further comprising:
   receiving a second plurality of parameter values, each of said second plurality of parameter values indicating said exposure state parameter in a second type of lithography process of said process flow when processing a second plurality of substrates;
   receiving a second plurality of measurement results, each one of said second plurality of measurement results being associated with a respective one of said second plurality of parameter values;
   comparing a second global value obtained from each of said second plurality of parameter values and each of said second plurality of measurement results and a variance thereof with a second local value obtained from a subset of said second plurality of parameter values and a subset of said second plurality of measurement results and said variance, said subset of said second plurality of measurement results being associated with said subset of said second plurality of parameter values; and
   outputting said out-of-control signal when a result of said comparison based on said second global value and said second local value is outside of said predefined valid range.

9. The method of claim 8, wherein said first type of a lithography process and said second type of a lithography process differ at least in a target process result.

10. The method of claim 9, wherein said first type of lithography process and said second type of lithography process differ at least in a process path of said process flow.

11. The method of claim 1, wherein said process parameter represents an exposure dose.

12. The method of claim 1, wherein said measurement results represent a critical dimension of a resist feature.

13. A method of monitoring a lithography process flow in a semiconductor manufacturing process sequence, the method comprising:

performing a plurality of different types of lithography processes by processing a plurality of substrates for each type of lithography process;

obtaining parameter values and associated measurement results for each type of said plurality of different types of lithography processes, said parameter values being associated with an exposure parameter and said associated measurement results representing a process output of said plurality of different types of lithography processes;

determining a weighed ratio, by using said parameter values and said associated measurement results, for each of said plurality of different types of lithography processes, wherein determining a weighed ratio for each of said plurality of different types of lithography processes comprises determining a first mean value of ratios for a predefined number of lithography processes of each type and determining a second mean value of ratios of a subset of said predefined number of lithography processes and weighing a difference of said first and second mean values by using a standard deviation of said predefined number of lithography processes; and comparing each of said weighed ratios with a single predefined valid control range.

14. The method of claim 13, further comprising outputting an out-of-control signal when any of said weighed ratios is outside of said predefined valid control range.

15. The method of claim 13, wherein determining a weighed ratio for each of said plurality of different types of lithography processes further comprises determining a minimum weight and comparing said standard deviation with said minimum weight.

16. The method of claim 15, further comprising weighing said difference by using said minimum weight when said standard deviation is less than said minimum weight.

17. The method of claim 13, wherein said parameter values have associated therewith a time stamp and wherein said subset corresponds to the most recent lithography processes according to said time stamps.

* * * * *